United States Patent [19]

Kuny

[11] 4,066,985
[45] Jan. 3, 1978

[54] TELEVISION IF FILTER CONSTRUCTED IN ACCORDANCE WITH THE SURFACE WAVE PRINCIPLE

[75] Inventor: Wilhelm Kuny, Gruenwald, Germany

[73] Assignee: Siemens Aktiengesellschaft, Berlin & Munich, Germany

[21] Appl. No.: 692,223

[22] Filed: June 2, 1976

[30] Foreign Application Priority Data

June 3, 1975   Germany .............................. 2524649

[51] Int. Cl.² .................... H03H 9/04; H03H 9/26; H03H 9/32; H01L 41/10
[52] U.S. Cl. ...................................... 333/72; 310/313; 310/323; 310/366
[58] Field of Search .................. 333/72, 30 R; 310/8, 310/8.2, 9.8; 330/5.5; 358/21, 36, 38; 331/107 A

[56] References Cited

U.S. PATENT DOCUMENTS

| 3,582,540 | 6/1971 | Adler et al. ................... | 333/72 X |
| 3,858,118 | 12/1974 | Daniel ................................ | 333/72 X |

Primary Examiner—Alfred E. Smith
Assistant Examiner—Marvin Nussbaum
Attorney, Agent, or Firm—Hill, Gross, Simpson, Van Santen, Steadman, Chiara & Simpson

[57] ABSTRACT

A television IF filter constructed in accordance with the surface wave principle comprises an input transducer and two output transducers constructed in interdigital form, the output transducers being arranged symmetrically with respect to the input transducers upon a piezo-electric substrate. An input transducer comprises a main section and a subsidiary section. The main and subsidiary sections are electrically and mechanically connected in parallel, the main section being tuned to the center of the television IF frequency and having a variable overlapping range of the transducer teeth corresponding to a function $y = \sin x/x$. The resonant frequency of the subsidiary section is tuned in such a manner that a step in the filter curve at the sound frequency, looking like staircase is produced. The output transducers also have a main section and a subsidiary section, respectively, whose respective resonant frequencies are tuned to that of the input transducer section which is associated therewith. The main and subsidiary sections of the output transducers are electrically connected in parallel and the output transducers are connected in series. The overlapping range of the teeth of the main subsidiary sections of the output transducers is constant and the length of the teeth of the subsidiary sections are shortened, as compared with those of the main sections, in accordance with the level difference at the sound and picture carrier frequency, respectively of the transmission curve. The filter produces an asymmetric frequency curve corresponding to the standard curve of a television IF filter with the help of the interdigital transducers having constant tooth spacings. The symmetrical arrangement of the output transducers with respect to the transmission converter compensates capacitive cross talk and the level step of the filter curve at the sound frequency is produced by transducer structures whose tooth length is shortened in correspondence with the desired level difference.

6 Claims, 2 Drawing Figures

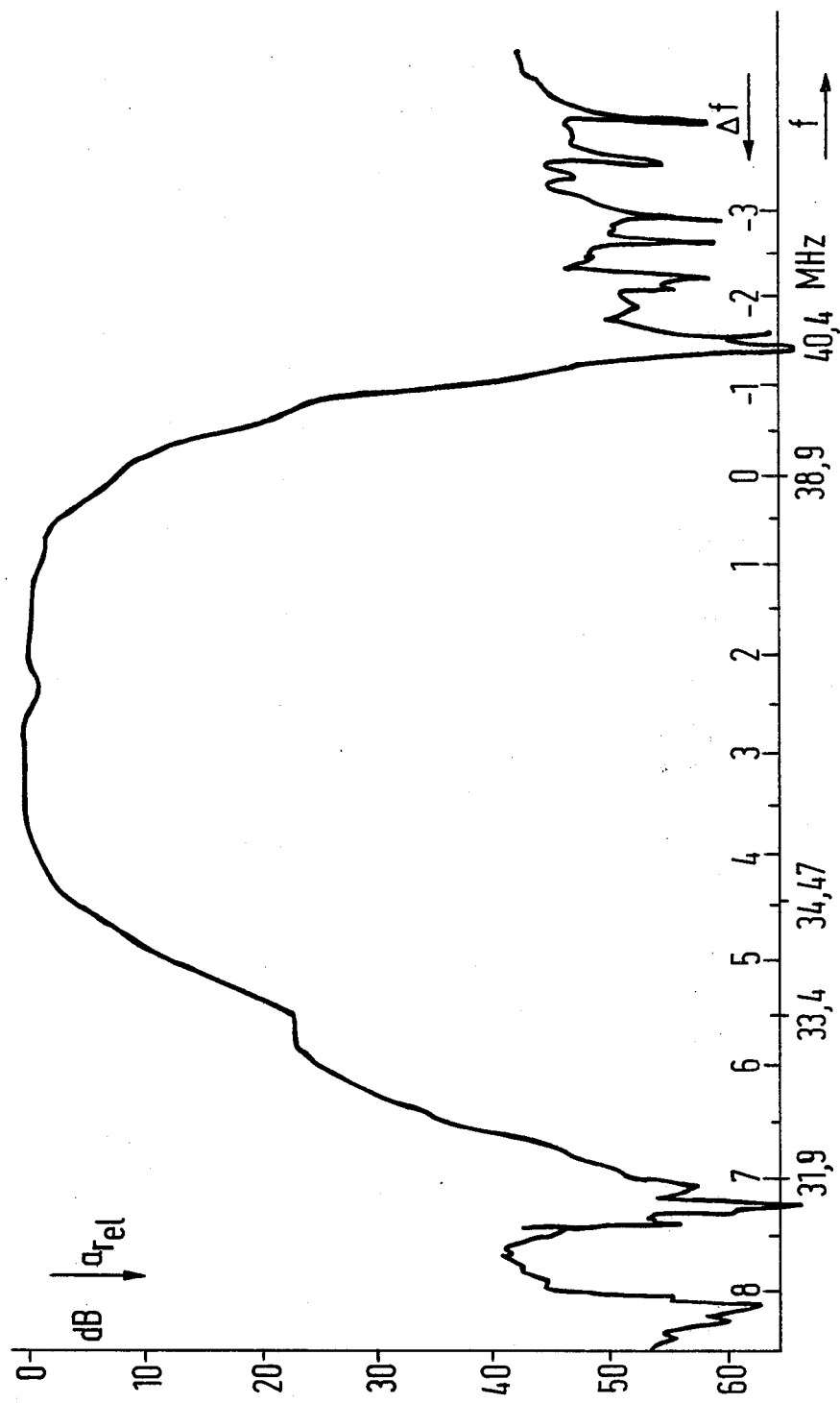

TELEVISION IF FILTER CONSTRUCTED IN ACCORDANCE WITH THE SURFACE WAVE PRINCIPLE

BACKGROUND OF THE INVENTION

1. Field of the Invention

The present invention relates to a television intermediate frequency filter constructed in accordance with the surface wave principle and comprising an input transducer and two output transducers constructed in interdigital form and arranged symmetrically with respect to the input transducer.

2. Description of the Prior Art

Filters designed in accordance with the surface wave principle, in which surface waves are produced with the help of so-called interdigital transducers, are well known in the art. If the teeth of the interdigital transducers have a constant overlapping range, a frequency transmission curve will result corresponding to the function $y = \sin f/f$.

This frequency transmission curve, however, has a band width which is too narrow for practical applications. Furthermore, the selectivity is not sufficiently high. It was therefore attempted to produce transducers having a broader transmission curve and better selectivity. For this purpose, various paths were tried. Either the overlapping range of the transducer teeth was varied, as is described for example in the German Offenlegungschrift No. 2,238,845, or several transducers having differing resonant frequencies were connected in parallel, as is described for example in the German Offenlegungsschrift No. 2,018,308 which corresponds to the British Letters Patent No. 1,322,833.

The techniques described previously result in filter pass curves which are symmetrical about a center frequency. Asymmetric pass curves were produced, for example, by making the spacing of the individual transducer teeth different from one another. Asymmetric frequency paths have also been obtained in the past by way of connecting several transducers in parallel.

The capacitive cross talk between input transducers and output transducers provide difficulties in the case of these simple filters which operate on the surface wave principle. This capacitive cross talk will deteriorate, in particular, the selectivity in the stopband range. It has thus already been suggested to obtain a compensation of the capacitive portions by way of a suitable arrangement of the electrodes upon the substrate. Such an arrangement is shown, for example, in the German Offenlegungsschrift No. 2,235,233. In this type of arrangement, two output transducers are provided which are arranged symmetrically with respect to the input transducer. The "hot" electrodes of the input transducer and output transducers thereby have as great a spacing from one another as possible. In addition, screening strips are inserted in the connection line between the contact points of the "hot" electrodes, which strips are connected to ground between the transducers.

The technique for lowering the capacitance between the input transducer and the output transducer, which is suggested in itself, and which resides in separating the transducers as far as possible from one another, requires an undesirably large substrate and a great pass band attenuation, since the ultrasonic beam fans open on its path from the input transducer to the output transducer, due to unavoidable difractions. For this reason, other techniques for lowering the capacitive cross talk must be given.

SUMMARY OF THE INVENTION

The present invention is based upon the object of providing a filter of the initially mentioned kind for television systems in which the sound is transmitted with frequency modulation, whereby the filter fulfills the requirements which are to be made with respect to the transmission curve of an IF filter.

The above object is achieved in a structure in which the input transducer comprises a main section and a subsidiary section, the main and subsidiary sections being electrically and mechanically connected in parallel. The main section is tuned to the center of the television IF frequency and has a variable overlapping range of the transducer teeth corresponding to the function $y = \sin x/x$. The resonant frequency of the subsidiary section is tuned in such a manner that a step in the filter passband at the sound frequency is produced. The output transducers also have a main section and a subsidiary section, respectively, the respective resonant frequencies being tuned to that of the input transducer section which is associated therewith. The main and subsidiary sections of the output transducers are electrically connected in parallel and the two transducers are connected in series with one another. The overlapping range of the teeth of the main and subsidiary sections of the output transducers is constant and the length of the teeth of the subsidiary sections are shortened with respect to those of the primary sections in accordance with the desired level difference at the sound and picture carrier frequency respectively of the frequency pass curve.

Thus, the advantages result that the input transducer and the output transducers respectively form a new inseparable unit, that the line losses within the filter and between the transducers of equal function can be kept as low as possible, and that the parasitic capacitive stray fields are relatively small and may, in addition, be well compensated.

BRIEF DESCRIPTION OF THE DRAWINGS

Other objects, features and advantages of the invention will be best understood from the following detailed description of a preferred embodiment of the invention, taken in conjunction with the accompanying drawings, on which:

FIG. 2 is a graphic illustration of the transmission characteristic of the filter of FIG. 1 in terms of attenuation versus frequency and change in frequency.

DESCRIPTION OF THE PREFERRED EMBODIMENT

Figure 1:
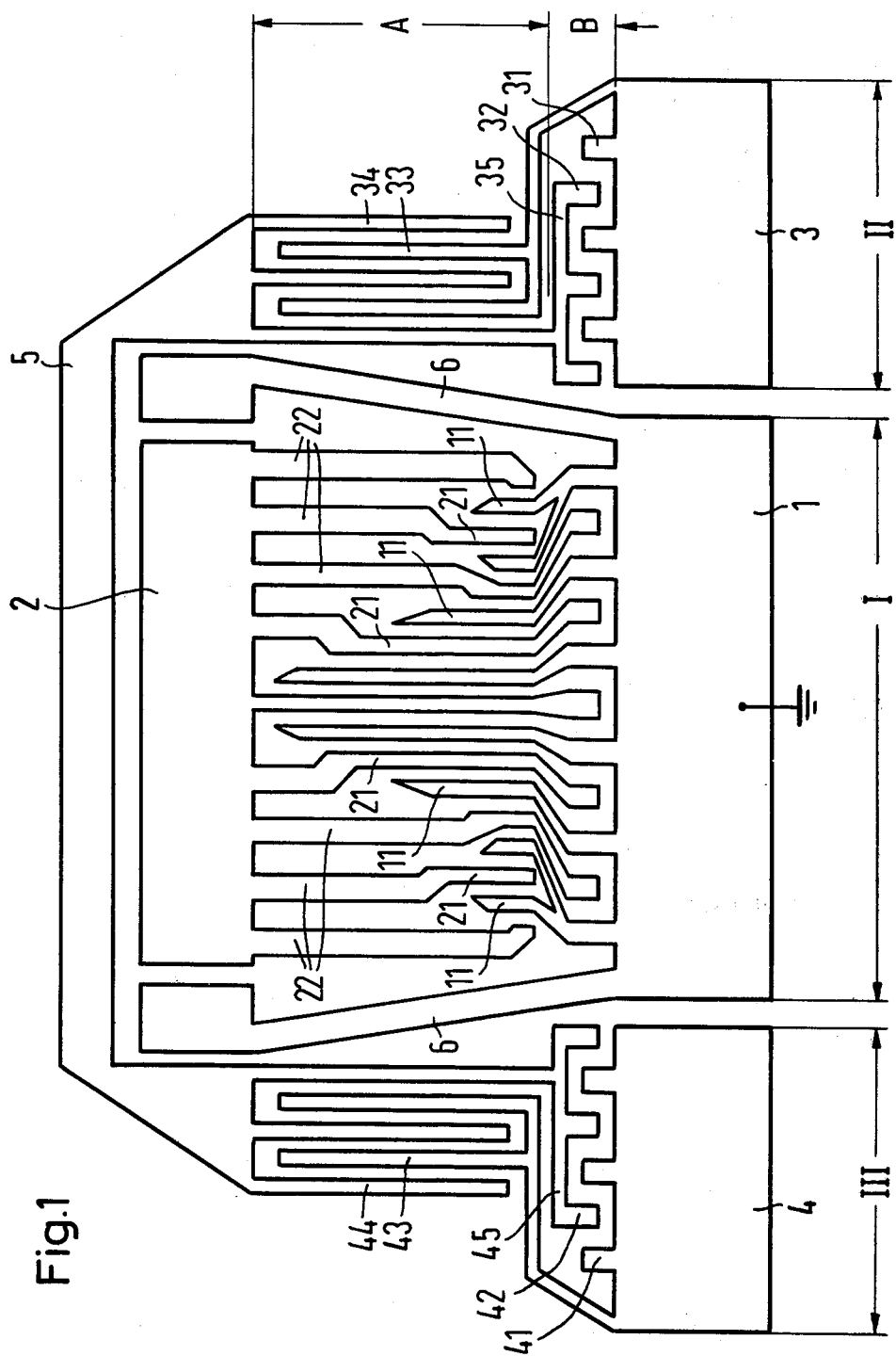
FIG. 1 is a plan view of a converter configuration constructed in accordance with the present invention.

FIG. 1 illustrates a transducer configuration for a filter constructed in accordance with the present invention which is constructed with the help of a photo-etching technique upon a piezo-electric substrate. A center input transducer I can be recognized and two output transducers II and III, respectively, are arranged symmetrically with respect to the input transducer I. Each of the input and output transducers is subdivided into two sections A and B, respectively, which have different resonant frequencies and paths characteristics.

The feeding-in of electical energy into the input transducer I is effected in a manner wherein the contact surface 1 is connected to ground and the contact surface 2 serves to receive the incoming electrical signal. The decoupling of the intermediate frequency at the output transducers II and III, respectively, is effected symmetrically with respect to ground at the contact surfaces 3 and 4. This arrangement is particularly suited for the further processing of integrated circuits which normally comprise two inputs which are symmetrical with respect to ground. This arrangement, whereby the two output transducers II and III, respectively, are connected in series with each other by way of a connection line 5, permits, in addition, an optimum compensation of the capacitive stray field which is due to the input transducer I. In order to further decrease the capacitive stray fields, screening strips 6 connected to ground are provided between the input transducer I and the output transducers II and III.

The secondary sections B of the transducers I, II and III are tuned at their resonant frequency in such manner that sound step is produced in the IF filter pass curve, for example at 33.4 MHz. This tuning can either be effected in such a way that the main resonance maximum of the secondary sections B itself is located at 33.4 MHz, or so that the first sidelobe maximum is located at this frequency. The main section A of the input transducer I comprises teeth 11 and 21 having different lengths. The tooth length varies in accordance with a function $y = \sin x/x$. The connection between the contact surface 2 and the transducer teeth 21 which are to be shortened is effected with the help of supply lines 22, the width of the supply lines 22 being twice that of the transducer teeth 11 and 21 and the supply lines 22 being spaced at twice the distance as the teeth. Due to this particular embodiment of the supply lines 22, it is obtained that the acoustic waves, which reflect at the front and rear edges of the supply lines 22 cancel one another due to interference. In this manner, the influence of the supply lines 22 onto the frequency curve of the filter remains at a minimum.

The transducer teeth 33, 34 and 43, 44 of the main sections A of the output transducers II and III, respectively, have a constant length. The length of the teeth, as well as their number, is calculated-as well known in the art-in such a way, together with the teeth 11 and 21 of the input transducer I, to result in a centered television IF pass curve having a band width of approximately 4.5 MHz.

The subsidiary sections B provided for the production of the step in the filter curve at the sound carrier frequency have teeth 31, 32 and 41, 42, respectively, with constant overlapping ranges. The length of the overlapping teeth of the subsidiary sections B is very short due to the level difference required in accordance with the television standards, which results in a slight bundling of the surface wave. An improvement may be obtained in such a manner that the subsidiary range B of the input transducer I is clearly broadened (for example four times) with respect to the theoretically required width, and only the required beam width from the center of this latter transducer is utilized by the associated output transducers II B and III B; in addition, an improvement of the realization is possible in such a way that the subsidiary section B is electrically separated from the main section A in the case of one of the output transducers II and III, which are now twice as wide. In order to prevent interference with the capacitive symmetry, the transducer teeth themselves must remain upon the piezoelectric substrate. These two opposite requirements are fulfilled in a simple manner in such a way that only the connection line 35 between the transducer teeth 32, or the connection line 45 between the transducer teeth 42, respectively, is removed.

FIG. 2 illustrates the frequency curve measured in accordance with the surface wave principle in the case of a television IF filter constructed in accordance with the invention. The relative attenuation is decibels has been illustrated on the vertical axis of the coordinate system and the frequency f has been specifically set forth on the horizontal axis long with the frequency difference $\Delta f$, referring to the frequency of the picture carrier.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I CLAIM:

1. A television IF filter in accordance with the surface wave principle, comprising:
   a piezoelectric substrate,
   an input transducer and a pair of output transducers constructed in toothed interdigital form, said output transducers arranged symmetrically of said input transducer and all three carried on the same surface of said substrate,
   said input transducer comprising a main section and a subsidiary section electrically and mechanically connected in parallel with said main section,
   said main section tuned to the center IF frequency and includes teeth having a variable overlapping range corresponding to the function $y = \sin x/x$,
   said subsidiary section having a tuned resonance to produce a step in the filter curve at the sound carrier frequency,
   each of said output transducers comprising a main section and a subsidiary section each tuned to the resonance of the corresponding input transducer sections,
   said output transducers connected in series with each other and said main and subsidiary sections of each of said output transducers connected in parallel,
   said main and subsidiary sections of each of said output transducers comprising teeth having a constant overlapping range,
   the length of said teeth of said subsidiary sections being less than the length of said teeth of said main sections in accordance with the level different at the sound and picture carrier frequency, respectively, of the pass characteristic curve.

2. The television IF filter of claim 1, wherein said subsidiary sections are tuned to provide a first sidelobe maximum in the transmission curve to produce a step in the filter curve at the sound carrier frequency.

3. The television IF filter of claim 1, comprising screen strips adapted for connection to ground and carried on said substrate between said input and output transducers.

4. The television IF filter of claim 1, comprising contact electrodes for each of said subsidiary sections, and a gap between one of said subsidiary sections of an output transducer and its respective contact electrode in order to maintain capacitive symmetry while utilizing only the acoustic transmission from the central transducer to the other subsidiary output transducer.

5. The television IF filter of claim 1, comprising a contact electrode for said input transducer and supply lines, wherein the teeth of the main section of said input transducer are connected by said supply lines to said contact electrode outside of the tooth overlap range of the input transducer teeth, said supply lines having twice the width of said teeth and being spaced apart twice the overlap range spacing of the teeth.

6. The television IF filter of claim 1, wherein the length of said teeth of said subsidiary section of said input transducer is greatly in excess of the length required by the level difference, and wherein only the center of the sonic beam emitted by said input transducer subsidiary section is utilized by the subsidiary sections of said output transducers.

* * * * *